(12) United States Patent
Winter et al.

(10) Patent No.: US 7,728,507 B2
(45) Date of Patent: Jun. 1, 2010

(54) RADIATION-EMITTING COMPONENT PROVIDED WITH METALLIC INJECTED-MOLDED CARRIER

(75) Inventors: Matthias Winter, Regensburg (DE); Harald Jäger, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 736 days.

(21) Appl. No.: 11/518,401

(22) Filed: Sep. 8, 2006

(65) Prior Publication Data

US 2007/0075451 A1    Apr. 5, 2007

(30) Foreign Application Priority Data

Sep. 30, 2005  (DE) ............ 10 2005 047 167
Jul. 13, 2006  (DE) ............ 10 2006 032 415

(51) Int. Cl.
*H01L 23/495* (2006.01)

(52) U.S. Cl. ............ 313/498; 313/512; 257/98; 257/99; 257/100; 257/666; 257/676

(58) Field of Classification Search ......... 313/498–512; 257/98–100
See application file for complete search history.

(56) References Cited

U.S. PATENT DOCUMENTS

| | | | |
|---|---|---|---|
| 4,179,619 A | * | 12/1979 | Cook ............ 250/551 |
| 5,689,796 A | | 11/1997 | Kasai et al. |
| 5,963,773 A | | 10/1999 | Yoo et al. |
| 6,274,890 B1 | * | 8/2001 | Oshio et al. ............ 257/98 |
| 6,900,511 B2 | | 5/2005 | Ruhnau et al. |
| 2003/0039571 A1 | | 2/2003 | Lim et al. |
| 2003/0189830 A1 | * | 10/2003 | Sugimoto et al. ......... 257/100 |
| 2006/0284305 A1 | * | 12/2006 | Yen et al. ............ 257/708 |

FOREIGN PATENT DOCUMENTS

| | | |
|---|---|---|
| DE | 102 29 067 | 1/2004 |
| DE | 10 2004 057 804 | 6/2006 |
| JP | 2003163381 A  * | 6/2003 |

OTHER PUBLICATIONS

German Search Report dated Apr. 11, 2007 for application No. 06019934.6-2122.

Frank Möllmer et al., "Siemens-SMT-TOP-LED-LEDs for Surface Mounting", *Siemens Components*, vol. XXVI, No. 4-5, pp. 147-149 (1991).

\* cited by examiner

*Primary Examiner*—Mariceli Santiago
(74) *Attorney, Agent, or Firm*—Fish & Richardson P.C.

(57) ABSTRACT

A process is specified for producing a radiation-emitting component comprising a housing body and a carrier for a radiation-emitting semiconductor body, in which the carrier is produced in an injection molding process from a molding compound containing a metal.

40 Claims, 5 Drawing Sheets a)

b)

c)

d)

e)

a)

b)

c)

a)

b)

c)

RADIATION-EMITTING COMPONENT PROVIDED WITH METALLIC INJECTED-MOLDED CARRIER

CROSS REFERENCE TO RELATED APPLICATIONS

Pursuant to 35 U.S.C. §119, this application claims the benefit of German Application No. 102005047167.6, filed Sep. 30, 2005, and German Application No. 102006032415.3, filed Jul. 13, 2006. The contents of the prior applications are incorporated herein by reference in their entirety

TECHNICAL FIELD

This invention relates to a process for producing a radiation-emitting component comprising a housing body and a carrier. For example, one such process is a MIM (metal injection molding) production process or a powdered metal injection molding process, which is particularly suitable for the production of small, complex components.

BACKGROUND

In conventional surface-mountable optoelectronic components, a prehoused component is produced by overmolding a prefabricated leadframe with a suitable plastic material that forms the housing of the component. This component is provided, for example on its top side, with a depression or recess into which leadframe interconnects are run from two opposite sides, and on which a semiconductor chip, such as for example an LED chip, is glued and electrically contacted. Usually a transparent potting compound is then poured into this recess. This basic design for surface-mountable optoelectronic components is known for example from the article "Siemens SMT TOPLED for surface mounting," by F. Möllmer and G. Waitl, *Siemens Components* 29 (1991), Vol. 4, pp. 147-149.

SUMMARY

Preferred embodiments relate to a process suitable for the simplified production of a carrier for a radiation-emitting component, and a radiation-emitting component that comprises a carrier and can be produced in as simple a manner as possible.

In one aspect of the process for producing a radiation-emitting component comprising a housing body and a carrier, the carrier is produced in an injection molding process from a molding compound containing a metal.

In one aspect of the radiation-emitting component comprising a housing body and a carrier, the carrier contains an injection-molded metal.

A carrier for a radiation-emitting component is preferably produced by means of a powder injection molding process, in which a powder containing the metal is preferably used to produce the carrier. With this process, the carrier and, moreover, the component can be produced in a simple manner as individual parts. As opposed to leadframe technology, in which the components must be singulated by separating processes such as for example punching, sawing or laser separation, here there is no need for the stress-inducing singulation process.

In the metal-based powder injection molding process, a fine powder or a paste containing the metal is first mixed with a binder and granulated. The molding compound obtained is termed the feedstock. The binder preferably contains a material composed of an organic compound, particularly preferably of a polymer, for example polyoxymethylene, so that a flowable compound suitable for the powder injection molding process is obtained when the molding compound is heated or compressed. A mold binder, preferably containing a material composed of an inorganic compound, can also be added to the molding compound.

The molding compound can be placed in an injection molding machine and there initially melted. The molding compound is poured into an injection mold and injected to produce a carrier molding (a so-called "green part"). The carrier molding can be demolded as soon as the molding compound has been cooled to a sufficient demold strength.

The binder is then removed from the carrier molding. This is preferably done via thermal evaporation and/or solvents and/or catalysis and/or pyrolysis. The binderless carrier molding (the so-called "brown part") is composed mainly of powder particles. The mold binder, which particularly preferably is not expelled during this operation, gives the carrier molding the necessary strength for subsequent handling.

The carrier molding is then sintered to yield the finished carrier. During sintering, the mold binder is first expelled. The temperature is not raised to the sintering temperature until there are no longer any residues of mold binder in the carrier molding. A labile powder skeleton is all that remains of the carrier molding at this point. Once the sintering temperature is reached, the gaps between the powder particles begin to fill up with material.

The carrier molding may shrink a great deal before attaining its final carrier shape. The shrinkage can amount to between 15% and 20%, depending on the binder content and mold binder content of the molding compound.

The sintering is preferably performed under vacuum or with a protective gas atmosphere. The protective gas atmosphere or vacuum is necessary to prevent undesirable chemical reactions. Inexpensive gases such as for example $H_2$ and CO are suitable for use as protective gases.

A material that contains an easily refinable metal is also preferably used for the powdered-metal injection molding process. Both a material containing an elemental metal and a material containing an alloy may be contemplated. Tungsten or a tungsten alloy is used with particular preference.

The choice of sintering temperature is guided by the material used; for example, with a tungsten-containing material it is between 1000° and 3000° C. It is advantageously unnecessary in this process to wait until the carrier has cooled to room temperature before removing it. The carrier can be removed after only a brief cooling period, thus shortening the production process.

In a preferred embodiment of the radiation-emitting component, the injection-molded carrier for a radiation-emitting semiconductor body is embedded in a housing body. This is accomplished by advantageously combining the production of the carrier with the production of the housing body. Particularly advantageously, the production of the carrier can be combined with the production of the housing body by means of an injection molding process. In particular, this injection molding process is a powder injection molding process.

The powder injection molding process for the housing body comprises steps that are analogous to those of the powder injection molding process for the carrier.

A first step is to prepare a molding compound for the housing body, containing a powder or paste, a binder, one or more auxiliary agents and a mold binder. The powder or paste can for example be a plastic powder or a plastic paste. Alternatively, the powder or paste can contain a ceramic material.

In a second step, the flowable molding compound, particularly heated, is poured into an injection mold in an injection molding machine and shaped into a housing molding. In a further step, the binder is removed from the molding, preferably via heating and/or solvents and/or catalysis and/or pyrolysis. In addition, the molding compound is sintered and the molding binder thereby removed. The choice of sintering temperature is governed by the material used for the housing body. In the case of a ceramic material, temperatures of between 300° C. and 2000° C. are feasible.

Individual steps for producing the carrier and for producing the housing body can be performed sequentially or in parallel.

In a first variant of the production process for a radiation-emitting component, two separate processes are performed. The carrier is produced by the powdered metal injection molding process. The housing body is also preferably fabricated by the powder injection molding process. The two separate parts are then joined together. This can be accomplished by mounting the housing body on the carrier. For mounting purposes, the housing body can for example be provided with mounting studs that extend into depressions on the carrier.

In a second variant of the production process for a radiation-emitting component, first the carrier is produced by the powdered metal injection molding process, all the process steps being carried out. The finished carrier is then placed in an injection mold, where it is overmolded with a material that forms the housing body. The overmolding takes place according to the process steps described in connection with the powder injection molding process for a housing body. Advantageously, the housing body can be expected to shrink during sintering. The housing body thus shrinks onto the carrier, thereby improving the adhesion between the housing body and the carrier.

In a third variant of the production process for a radiation-emitting component, the carrier molding is placed in an injection mold and overmolded with the molding compound of the housing body. The binder is then removed according to one of the aforesaid methods. The carrier molding and the housing body molding are sintered jointly and are removed after a brief cooling period. This yields a radiation-emitting component that has an injection-molded carrier and housing body. In this process, advantageously only one injection molding machine is used and two-component (2C) powder injection is performed. Simple and low-cost production of a radiation-emitting component can be achieved in this manner.

Hence, although two different injection molds are needed to produce a radiation-emitting component comprising a carrier and a housing body that are both fabricated in an injection molding process, the process does not necessarily require two injection molding machines. Instead, the two injection molding processes can take place in a common injection molding machine, for example using a slide mold or for example making the transfer to another injection mold (a so-called "mold nest") by means of a turntable, adapter plate, handling apparatus or die mold. The term "injection mold" in this context is understood to mean a shape-imparting region or mold that gives the molding compound its conformation.

The injection molding process advantageously can be used to create complex geometries. For example, during the shaping, allowance can be made for depressions in the carrier to anchor the housing body. In the case of stamped leadframes, such depressions must be stamped in an additional step.

In addition, the injection molding process makes it possible to give the carrier and the housing body precise dimensions, to tolerances of ±0.5%.

A metallization is usefully applied to the carrier, for example by a galvanic process, so that the radiation-emitting component mounted on the carrier can be electrically connected. Before the metallization is applied, the carrier is preferably cleaned of residues from the two injection molding processes, for example by plasma cleaning or wet chemical cleaning.

Panelization can be advantageous in simplifying the application of the metallization to the carrier by a galvanic process. However, the components then have to be singulated, which can lead to stress exposure during the separation of the components.

In the case of a radiation-emitting component that must be aging- and cycle-resistant, UV stability and high-temperature resistance are important criteria. These criteria can advantageously be satisfied if a ceramic material is used for the housing body. Particularly advantageously, the ceramic material contains $Al_2O_3$ and/or $ZrO_2$. These materials have proven to be very especially advantageous if the housing body has a recess serving as a reflector.

Moreover, an injection-molded plastic material can advantageously be used to produce the housing body. One advantage of a powder injection molded housing body is its rough surface, which facilitates the application of materials, for example potting materials.

Moreover, the molding compound from which the housing body is produced can contain a suitable mixture of materials, for example operative to improve adhesion to the potting materials used to fill the recess in which the radiation-emitting semiconductor component is preferably disposed. The recess can be at least partially filled, to protect the semiconductor body against harmful external influences. The adhesion can be adjusted by modifying the composition of the materials used for the housing body.

The adhesion can be further improved by providing special anchorages—undercuts, for example—for a potting compound. In particular, the housing body can comprise an overflow rim to which excess potting material can escape from the recess, in which case the excess potting material preferably covers the filled recess and improves adhesion.

Radiation-permeable materials, particularly transparent ones, are advantageously suitable for use as potting materials. Reaction resins such as for example epoxy resins, acrylic resins, silicone resins and polyurethane resins or a mixture of these resins is preferably used. A silicone resin has been found to be advantageous in terms of cycle resistance, aging stability and radiation resistance, particularly in the blue and ultraviolet regions of the spectrum.

Moreover, hybrid materials such as for example mixtures of epoxy resins and silicone resins are particularly suitable, since they possess the advantages over silicone resins of having shorter cure times, better demoldability and better adhesive properties to the carrier material. Compared to epoxy resins, hybrid materials have the advantage of increased UV stability.

Improved adhesion is also desirable for a metallization layer that is applied. The metallization layer is preferably applied to the inner walls of the housing body that delimit the recess. They can serve as a reflector that reflects the radiation from the semiconductor body in the recess, thereby increasing light extraction from the component. Alternatively, the housing body can contain particles having a reflective effect, for example composed of $TiO_2$, thereby increasing reflectance. This embodiment option of an optical reflector is an advantageous alternative, since it is easy to implement and also eliminates the need for one production step, metallizing the inner walls.

Conveniently, the radiation characteristic and the intensity of the radiation emitted by the component can be favorably influenced by the reflector, thus improving the output of the radiation-emitting component.

The recess can for example taper down from a top side of the housing body disposed oppositely from the carrier, and be configured as funnel-shaped. An envelope in the recess can contain, in addition to the potting material, a conversion material by means of which the radiation emitted by the semiconductor body can be partially converted into radiation of a greater wavelength. By mixing radiation of different wavelengths, for example "white" light can be generated.

A radiation-emitting component may give off heat due to energy losses when operating, which can have an adverse effect on long-term operability. A bearing surface of the radiation-emitting component therefore preferably comprises thermal interconnect areas. Particularly advantageously, the housing body is provided on the side facing the bearing surface with a recess for a cooling element. The cooling element is further preferably also formed of an injection-molded material, which may contain a metal or a ceramic material.

Additional features, advantages and improvements of a radiation-emitting component will become apparent from the following exemplary embodiments explained in conjunction with FIGS. 1 to 6.

DESCRIPTION OF DRAWINGS

Like or like-acting elements are provided with the same reference numbers.

In the drawings.

DETAILED DESCRIPTION

FIGS. 1a to 1e show an exemplary embodiment of a metal-based powder injection molding process for producing a carrier for a radiation-emitting component.

Figure 1:
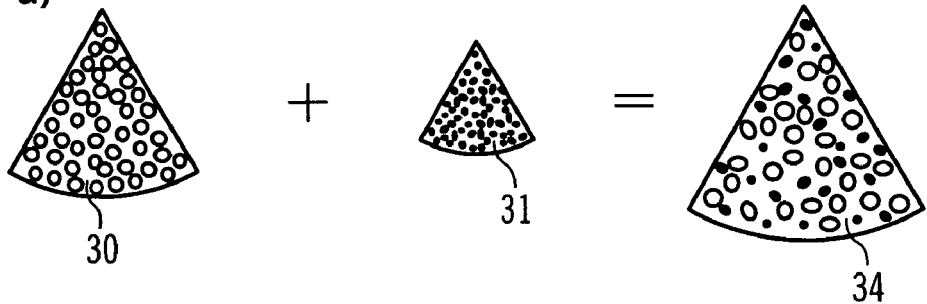
FIGS. 1a to 1e provide a schematic illustration of an exemplary embodiment of a inventive process based on five production steps.
Figure 1:
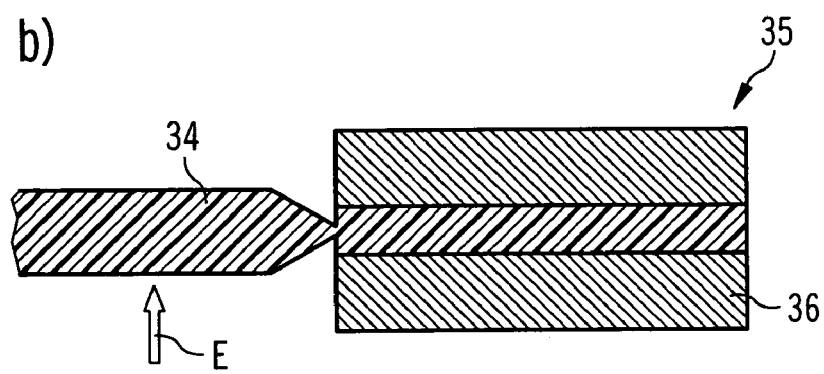
Figure 1:
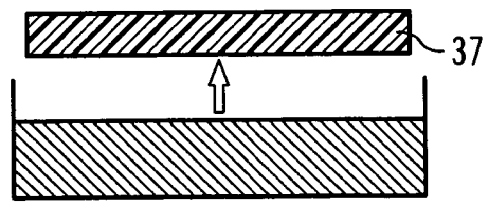
Figure 1:
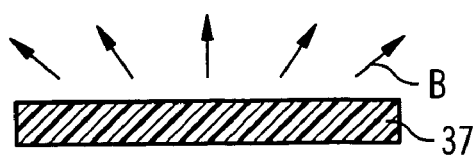
Figure 1:
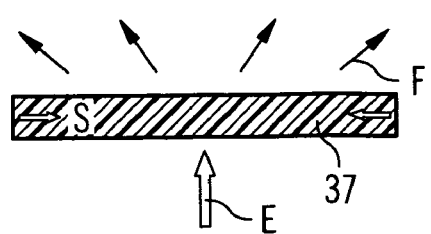

FIG. 1a shows a first step, in which a fine powder 30 containing a metal, preferably tungsten or a tungsten alloy, is mixed with additives 31, a binder, a mold binder and auxiliary agents and granulated into a molding compound 34. The average particle diameter is between 5 and 10 µm.

Particularly preferably, the binder contains a material composed of an organic compound, for example a polymer, that increases the plastic formability of the molding compound when it is heated or compressed. The mold binder contains an organic material.

The molding compound 34 is fed into an injection molding machine 35, as illustrated in FIG. 1b, and heated (arrow E) to produce a flowable compound, which is fed into an injection mold 36. In the injection mold 36, the molding compound cools down to a temperature at which it has attained sufficient demolding strength.

Once the demolding strength is sufficient, a carrier molding 37 formed in this way is demolded (see FIG. 1c).

The binder is then removed from the carrier molding 37, as indicated in FIG. 1d by arrows B. The debindering process to be used depends on the binder system. The most widely used process is catalytic debindering, since this gives the shortest debindering times. The debindering times are between a few hours and several days. This depends on the binder system and the wall thickness of the carrier molding.

FIG. 1e depicts a final step, sintering. In this step the mold binder is first removed (arrows F), by the application of heat (arrow E), from the binderless carrier molding 37, which is largely composed of powder particles and is substantially stabilized by the mold binder. The temperature is then raised to the sintering temperature, which for example in the case of a tungsten-containing material can be between 1000° C. and 3000° C., and the carrier molding is sintered to yield the finished carrier. Some shrinkage can be expected during this process (arrows S). The carrier can be removed after only a brief cooling period.

To produce a radiation-emitting component, the carrier can be provided with a housing body.

For example, a separately fabricated housing body can be mounted on the injection-molded carrier.

Alternatively, the finished carrier can be overmolded with a material for the housing body, in which case the carrier is placed in an injection mold and embedded in a molding compound for the housing body. The process steps described in FIGS. 1a to 1e are carried out in an analogous manner to produce the housing body.

A further option for producing an inventive component is 2C injection molding. Here, the steps of preparing and heating or compressing the molding compound for the carrier and the housing can be performed in parallel in a common injection molding machine. Both the carrier molding and the housing body molding can be formed in one injection mold that has been suitably partitioned. The two moldings are then demolded and sintered jointly.

A ceramic material is preferably used for the housing body, the average particle diameter being less than 1 µm.

Figure 2:
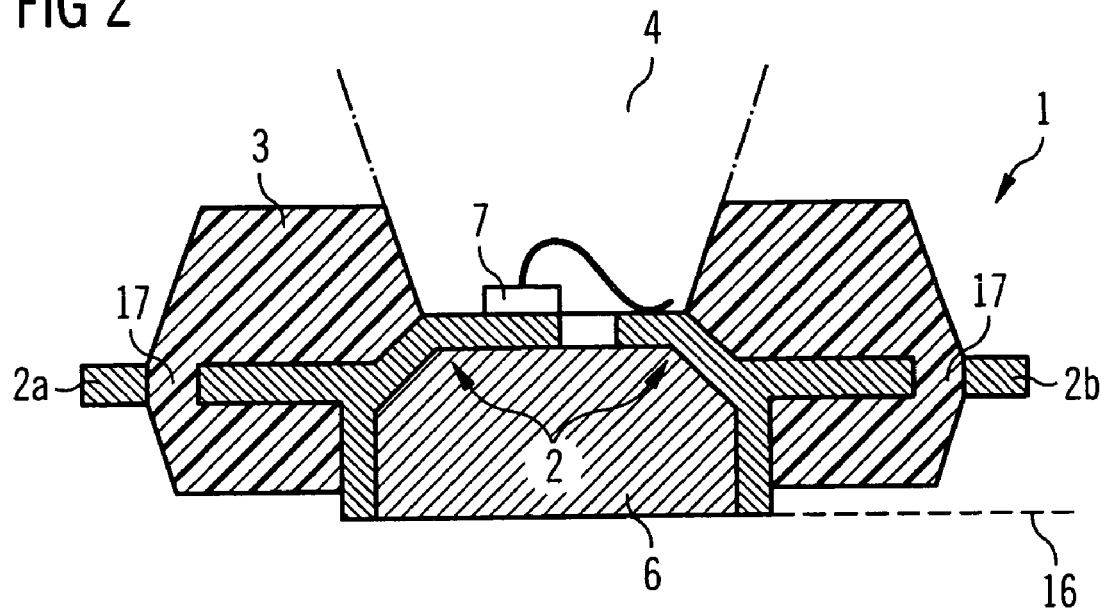
FIG. 2 is a schematic sectional view of a first exemplary embodiment of a radiation-emitting component.

Illustrated in FIG. 2 is a schematic sectional view of a first exemplary embodiment of a radiation-emitting component. The radiation-emitting component 1 comprises a powder injection molded housing body 3, in which a powder injection molded carrier 2 with two interconnect areas 2a and 2b is partially embedded. Interconnect areas 2a and 2b are planarly configured and extend parallel to the bearing surface 16 of the radiation-emitting component 1. Interconnect areas 2a and 2b are provided with depressions 17, which are filled with the material that the housing body 3 contains. The carrier 2 and the housing body 3 are rigidly connected to each other by this means.

A cooling element 6 is placed in the carrier 2 and connected at least peripherally to the carrier 2. The carrier 2 and the cooling element 6 are preferably configured as one piece. The cooling element 6 can also be produced by injection molding or powder injection molding.

In addition, the cooling element 6 can be configured as one piece with housing body 3.

The cooling element 6 preferably contains a thermally conductive or heat-absorbing material, for example a ceramic material, whereas the carrier 2 contains an electrically conductive material, for example an elemental metal or a metal compound. The carrier 2 serves as the leadframe, by means of which a radiation-emitting semiconductor body 7 can be electrically connected. Simultaneously, the heat generated during operation can be dissipated through the cooling element 6.

Semiconductor body 7 is mounted on the part of carrier 2 that is to be joined to interconnect area 2a and is connected by a bonding wire to the part of carrier 2 that is to be conductively connected to interconnect area 2b. The semiconductor body 7 can for example be a light-emitting diode chip, particularly a thin-film light-emitting diode chip. Semiconductor body 7 is disposed in a recess 4 of housing body 3.

Recess 4 is preferably configured as a reflector. This can be achieved by means of a metallization layer applied to the inner walls of housing body 3 that border on recess 4, but is preferably effected by means of particles, for example of $TiO_2$, that are introduced into housing body 3 and increase reflectance.

Figure 3:
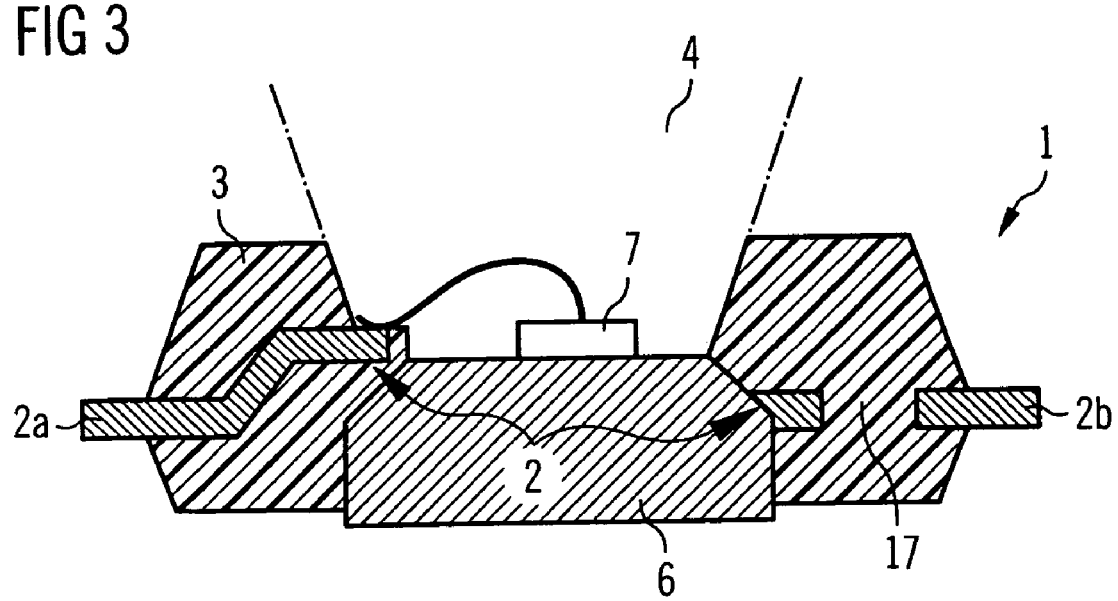
FIG. 3 is a schematic sectional view of a second exemplary embodiment of a radiation-emitting component.

Illustrated in FIG. 3 is a schematic sectional view of a second exemplary embodiment of a radiation-emitting component 1. The housing body 3 is hollowed out in a funnel shape in the upper region disposed oppositely from bearing surface 16. Disposed on the floor of the recess 4 so formed is the radiation-emitting semiconductor body 7. The latter is mounted on the cooling element 6, and the heat due to energy losses that is given off during operation can be dissipated through the cooling element 6.

The supply of electricity to semiconductor body 7 takes place through the bipartitely constructed carrier 2, which has two interconnect areas 2a, 2b. Interconnect area 2a extends into recess 4, where it lies exposed and is connected by a wire to semiconductor body 7. Interconnect area 2a is electrically isolated from cooling element 6 by housing body 3. It extends approximately in an S shape. Interconnect area 2b, on the other hand, extends planarly and is connected to cooling element 6. Interconnect area 2b and cooling element 6 are advantageously formed as one piece from a material that is both electrically and thermally conductive.

Interconnect area 2b comprises depression 17, which is filled with the material of housing body 3. This and the S-shaped configuration of interconnect area 2a serve to improve the anchoring of housing body 3 on carrier 2.

As in the first exemplary embodiment, the inner walls of housing body 3 are configured as a reflector.

Powder injection molding is suitable for producing a radiation-emitting component according to the second exemplary embodiment, as well as for producing a radiation-emitting component according to the first exemplary embodiment. The cooling element 6 and interconnect area 2b can in this case be configured as one piece. Interconnect area 2a can be produced separately and overmolded jointly with cooling element 6 and interconnect area 2b with a molding compound for housing body 3.

Figure 4:
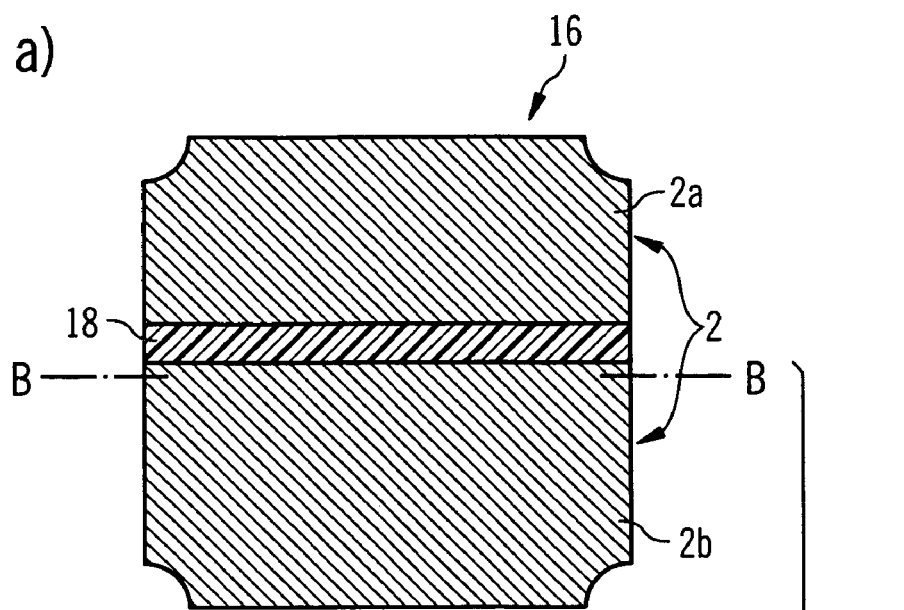
FIGS. 4a, 4b and 4c are three different schematic views of a third exemplary embodiment of a radiation-emitting component.
Figure 4:
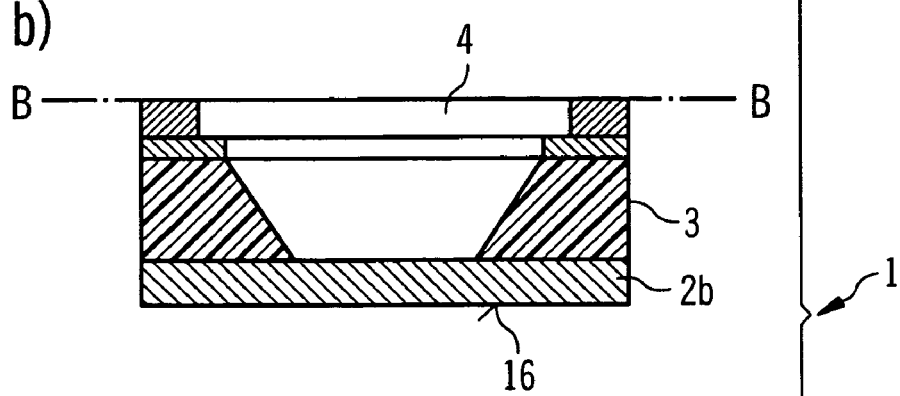
Figure 4:
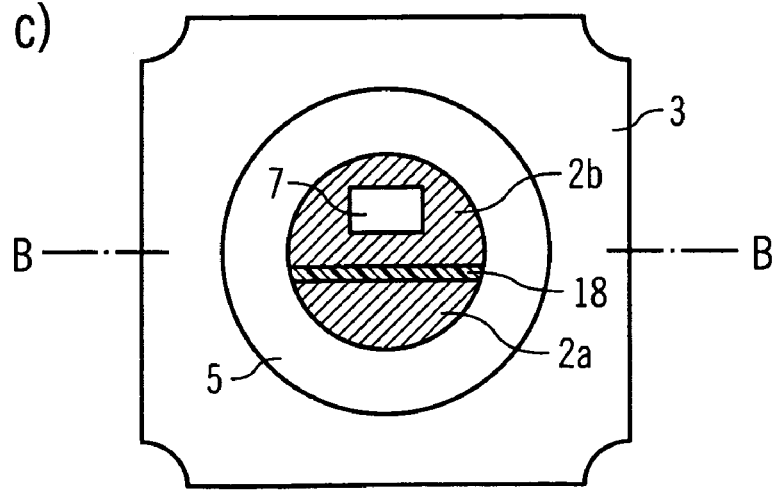

Three different views of a third exemplary embodiment of a radiation-emitting component 1 are illustrated schematically in FIGS. 4a, 4b and 4c.

FIG. 4a schematically represents the bearing surface 16 of the radiation-emitting component 1. Bearing surface 16 is divided into three areas: interconnect area 2a, isolating layer 18, and interconnect area 2b. Isolating layer 18 exerts an electrically isolating effect between the two interconnect areas 2a, 2b.

FIG. 4b schematically represents a cross section of the radiation-emitting component 1 along line B-B. Interconnect area 2b forms a lower boundary of radiation-emitting component 1. Disposed after interconnect area 2b is housing body 3. Housing body 3 is provided with a recess 4 that extends from interconnect area 2b to the upper side of radiation-emitting component 1, i.e. the side disposed oppositely from bearing surface 16.

Recess 4 has a pot-like shape and is divided into three areas, which supersede one another in a graded manner. This gradation simplifies for example the affixing of a cover or an optical element, preferably a lens. The anchoring of a potting compound, for example, can also be facilitated by this means. The upper region, which is bounded by an overflow rim, then serves to receive excess potting material with which the lower and middle regions are filled. The anchoring of the potting compound can be improved by having the overflow rim be set back from the parts of the housing body 3 located beneath it.

Inner walls of housing body 3 that border on recess 4 preferably serve as a reflector.

FIG. 4c schematically represents a plan view of the radiation-emitting component 1.

The inner walls of the housing body 3 form a reflector 5. Reflector 5 is delimited in the direction of the bearing surface by interconnect area 2a and interconnect area 2b. Interconnect area 2a is electrically isolated from interconnect area 2b by isolating layer 18. Mounted on interconnect area 2b is radiation-emitting semiconductor body 7. Semiconductor body 7 can be connected to interconnect area 2a by a wire bond.

The radiation characteristic of the radiation emitted by semiconductor body 7 can be suitably influenced by the reflector 5. Reflector 5 is preferably formed by the recess 4 of housing body 3 and contains a ceramic material, mixed with particles that increase reflectance. This material is electrically isolating, and housing body 3 can therefore be placed directly on interconnect areas 2a and 2b without causing a short circuit.

The radiation-emitting component 1 can be produced in a simple manner via two powder injection molding processes. Interconnect areas 2a and 2b can be fabricated by the powdered metal injection molding process. Housing body 3 can be produced by the powder injection molding process.

Figure 5:
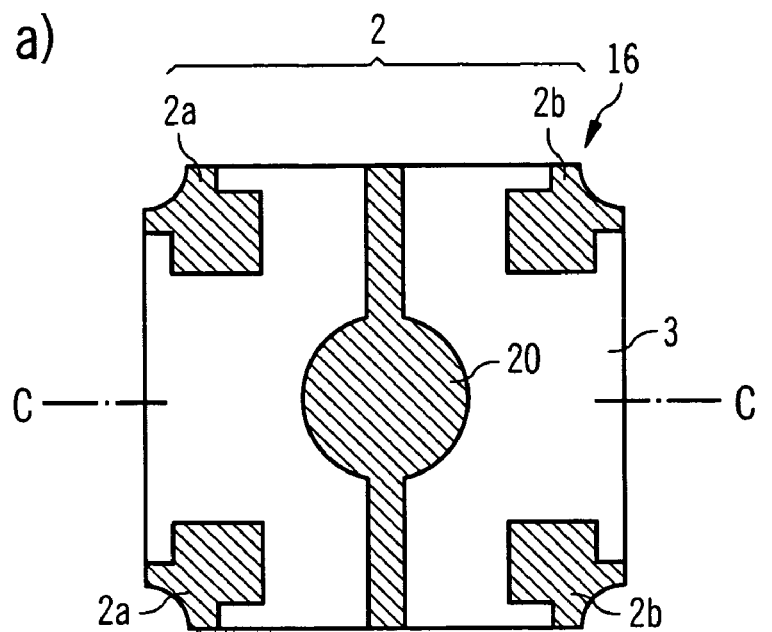
FIGS. 5a, 5b, and 5c are three different schematic views of a fourth exemplary embodiment of a radiation-emitting component.
Figure 5:
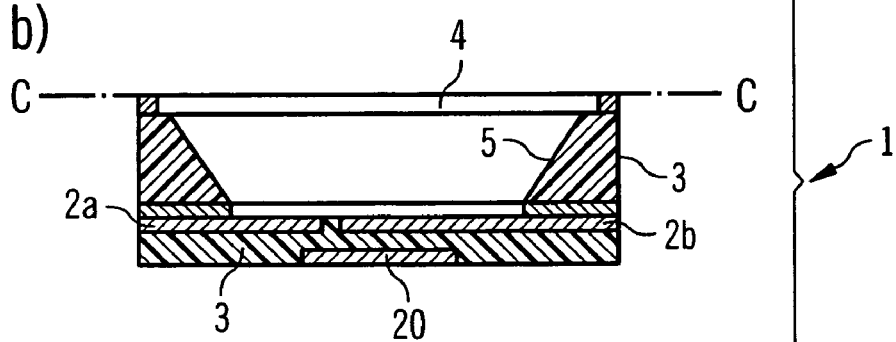
Figure 5:
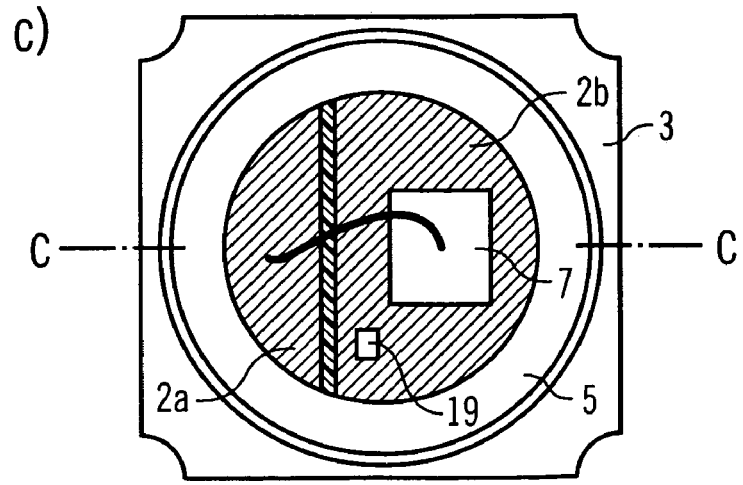

Illustrated in FIGS. 5a, 5b and 5c are three different views of a fourth exemplary embodiment of an inventive radiation-emitting component 1.

FIG. 5a schematically represents the bearing surface 16 of radiation-emitting component 1. Interconnect area 2a, interconnect area 2b and thermal interconnect area 20, to which a cooling element can be connected, are at least partially embedded in the housing body 3.

FIG. 5b schematically represents a cross section of the radiation-emitting component 1. Radiation-emitting component 1 is provided on its side facing the bearing surface with thermal interconnect area 20. Thermal interconnect area 20 usefully contains a heat-conducting material, for example a metal. Thermal interconnect area 20 is partially embedded in housing body 3, as are interconnect area 2a and interconnect area 2b, which can serve as electrical interconnects of different polarity.

The portion of housing body 3 facing away from the bearing surface is provided with recess 4. As in FIG. 4b, the inner walls of housing body 3 are graded, the reflector being formed only by the slanted inner walls. In this exemplary embodiment, a layer, preferably a metal layer, by means of which the reflectance can be increased is partially applied to the inner walls of housing body 3. The inner walls of housing body 3 are not metallized between interconnect areas 2a and 2b and reflector 5, so there is no risk of short circuits. The graded conformation of recess 4 in this exemplary embodiment also facilitates the application of a cover or an optical element and/or the anchoring of a potting compound.

FIG. 5c is a schematic depiction of the plan view of the radiation-emitting component 1. It shows housing body 3, in whose recess radiation-emitting semiconductor body 7 is disposed on interconnect area 2b. An ESD protection chip 19 is also mounted on interconnect area 2b. Interconnect area 2a is electrically isolated from interconnect area 2b by a discontinuity.

The radiation characteristic of the radiation emitted by the semiconductor body 7 can be influenced by means of the reflector 5 such that the radiation-emitting component 1 achieves high luminance.

As described in the foregoing exemplary embodiments, this component can also be produced in a simple manner by means of two powder injection molding processes.

Figure 6:
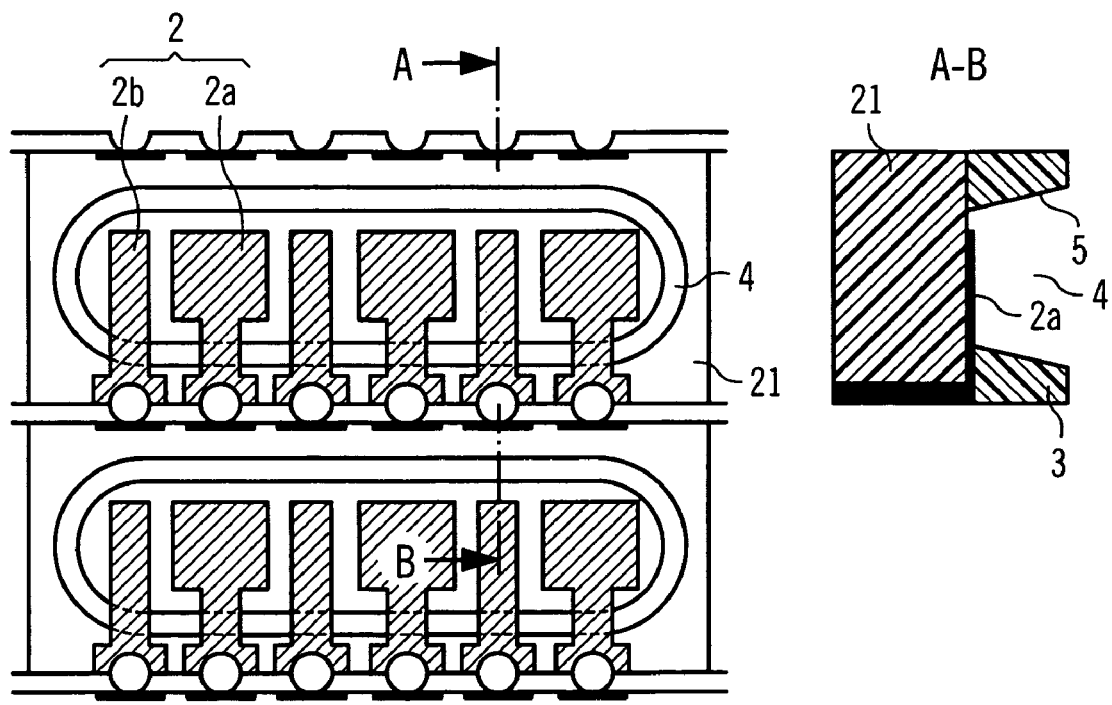
FIG. 6 is a schematic plan view of a possible arrangement of plural radiation-emitting semiconductor bodies.

FIG. 6 shows a schematic plan view of an arrangement of plural radiation-emitting semiconductor bodies. The semiconductor bodies are disposed in a common recess 4 with an oval cross section. As can be seen in sectional view A-B, two interconnect areas 2a and 2b are [verb missing] on a base body 21. A radiation-emitting semiconductor body can be mounted on square interconnect area 2a, while bar-shaped interconnect area 2b is used for topside contacting of the semiconductor body.

Interconnect areas 2a and 2b are preferably fabricated by means of the powdered metal injection molding process, whereas housing body 3 is produced by the powder injection molding process, for example based on ceramic. The base body 21 can be part of the housing body 3.

The advantage of the arrangement depicted in FIG. 6 is the use of reflector 5 for more than one radiation-emitting semiconductor body. For one thing, this simplifies production. For another, the radiation emitted by the various semiconductor bodies can be mixed in this way. This can be desirable for example for generating white light, in which case semiconductor bodies that emit radiation of different wavelengths are used in the arrangement.

The invention is not limited by the description provided with reference to the exemplary embodiments. Rather, the invention encompasses any novel feature and any combination of features, including in particular any combination of features recited in the claims, even if that feature or combination itself is not explicitly mentioned in the claims or exemplary embodiments.

What is claimed is:

1. A radiation-emitting component comprising a housing body and a carrier, wherein said carrier comprises an injection-molded metal and said housing body comprises an injection-molded ceramic material.

2. The radiation-emitting component as in claim 1, wherein said ceramic material comprises $Al_2O_3$.

3. The radiation-emitting component as in claim 1, wherein said ceramic material comprises $ZrO_2$.

4. The radiation-emitting component as in claim 1, wherein said housing body comprises a recess.

5. The radiation-emitting component as in claim 4, wherein a radiation-emitting semiconductor body is disposed in said recess.

6. The radiation-emitting component as in claim 5, wherein said radiation-emitting semiconductor body is a thin-film semiconductor body.

7. The radiation-emitting component as in claim 6, wherein said radiation-emitting semiconductor body is surrounded by an envelope.

8. The radiation-emitting component as in claim 7, wherein said envelope comprises a radiation-permeable material.

9. The radiation-emitting component as in claim 1, wherein said radiation-emitting semiconductor body is surrounded by an envelope that comprises a conversion material.

10. The radiation-emitting component as in claim 4, wherein said recess serves as a reflector for the radiation generated by said radiation-emitting semiconductor body.

11. The radiation-emitting component as in claim 1, wherein said housing body comprises particles that have a reflective effect.

12. The radiation-emitting component as in claim 11, wherein said housing body comprises particles of $TiO_2$.

13. The radiation-emitting component as in claim 1, wherein said housing body comprises a UV-stable material.

14. The radiation-emitting component as in claim 1, wherein said carrier serves as a leadframe.

15. The radiation-emitting component as in claim 1, wherein a contactable metallization is applied to said carrier.

16. The radiation-emitting component as in claim 1, wherein said carrier comprises adjuvant materials to promote adhesion.

17. The radiation-emitting component as in claim 1, wherein said housing body comprises adjuvant materials to promote adhesion.

18. The radiation-emitting component as in claim 1 comprising cooling element.

19. The radiation-emitting component of claim 18, wherein the carrier and the cooling element are configured as a single piece.

20. The radiation-emitting component of claim 18, wherein the cooling element comprises a ceramic material.

21. The radiation-emitting component of claim 18, wherein a radiation-emitting semiconductor body is mounted in a recess of the housing body in direct contact with the cooling element.

22. A radiation-emitting component comprising a housing body and a carrier, wherein said carrier comprises an injection-molded metal and said housing body comprises an injection molded plastic material.

23. The radiation-emitting component as in claim 22, wherein said housing body comprises a recess.

24. The radiation-emitting component as in claim 23, wherein a radiation-emitting semiconductor body is disposed in said recess.

25. The radiation-emitting component as in claim 24, wherein said radiation-emitting semiconductor body is a thin-film semiconductor body.

26. The radiation-emitting component as in claim 25, wherein said radiation-emitting semiconductor body is surrounded by an envelope.

27. The radiation-emitting component as in claim 26, wherein said envelope comprises a radiation-permeable material.

28. The radiation-emitting component as in claim 22, wherein said radiation-emitting semiconductor body is surrounded by an envelope that comprises a conversion material.

29. The radiation-emitting component as in claim 23, wherein said recess serves as a reflector for the radiation generated by said radiation-emitting semiconductor body.

30. The radiation-emitting component as in claim 22, wherein said housing body comprises particles that have a reflective effect.

31. The radiation-emitting component as in claim 30, wherein said housing body comprises particles of $TiO_2$.

32. The radiation-emitting component as in claim 22, wherein said housing body comprises a UV-stable material.

33. The radiation-emitting component as in claim 22, wherein said carrier serves as a leadframe.

34. The radiation-emitting component as in claim 22, wherein a contactable metallization is applied to said carrier.

35. The radiation-emitting component as in claim 22, wherein said carrier comprises adjuvant materials to promote adhesion.

36. The radiation-emitting component as in claim 22, wherein said housing body comprises adjuvant materials to promote adhesion.

37. The radiation-emitting component as in claim 22 comprising a cooling element.

38. The radiation-emitting component of claim 37, wherein the carrier and the cooling element are configured as a single piece.

39. The radiation-emitting component of claim 37, wherein the cooling element comprises a ceramic material.

40. The radiation-emitting component of claim 37, wherein a radiation-emitting semiconductor body is mounted in a recess of the housing body in direct contact with the cooling element.

* * * * *

UNITED STATES PATENT AND TRADEMARK OFFICE
CERTIFICATE OF CORRECTION

PATENT NO. : 7,728,507 B2  Page 1 of 1
APPLICATION NO. : 11/518401
DATED : June 1, 2010
INVENTOR(S) : Matthias Winter et al.

It is certified that error appears in the above-identified patent and that said Letters Patent is hereby corrected as shown below:

Column 10
Lines 24-25 (claim 32), after "comprising" insert the word -- a --

Signed and Sealed this

Twenty-fourth Day of August, 2010

David J. Kappos
*Director of the United States Patent and Trademark Office*